US012609435B2

(12) United States Patent
Lee et al.

(10) Patent No.: US 12,609,435 B2
(45) Date of Patent: Apr. 21, 2026

(54) FILTER MANUFACTURING METHOD AND FILTER MANUFACTURED BY THE METHOD

(71) Applicant: KOREA AEROSPACE RESEARCH INSTITUTE, Daejeon (KR)

(72) Inventors: Bo Young Lee, Daejeon (KR); Ok Chul Jung, Daejeon (KR); Myeong Shin Lee, Sejong-si (KR)

(73) Assignee: KOREA AEROSPACE RESEARCH INSTITUTE, Deajeon (KR)

( * ) Notice: Subject to any disclaimer, the term of this patent is extended or adjusted under 35 U.S.C. 154(b) by 805 days.

(21) Appl. No.: 17/977,308

(22) Filed: Oct. 31, 2022

(65) Prior Publication Data

US 2023/0138279 A1 May 4, 2023

(30) Foreign Application Priority Data

Nov. 1, 2021 (KR) ......................... 10-2021-0148121

(51) Int. Cl.
*H01P 11/00* (2006.01)
*G06F 30/373* (2020.01)
*H01P 1/20* (2006.01)
(52) U.S. Cl.
CPC .......... *H01P 11/007* (2013.01); *G06F 30/373* (2020.01); *H01P 1/20* (2013.01)
(58) Field of Classification Search
CPC ........ H01P 1/20; H01P 1/2082; H01P 11/007; H01P 11/008
See application file for complete search history.

(56) References Cited

U.S. PATENT DOCUMENTS 3,697,898 A * 10/1972 Blachier ................... H01P 7/06
333/209
5,930,266 A * 7/1999 Ramsey ................ H01P 1/2138
370/480

(Continued)

FOREIGN PATENT DOCUMENTS

CN 108736117 A 11/2018
JP 10075104 A 3/1998

(Continued)

OTHER PUBLICATIONS

Resonator Reuse Approach for Implementing Narrowband Bandpass-Bandstop Cascade Response, Boyoung Lee, et al., IEEE Transactions on circuits and systems-II: Express Briefs, May 2022.

(Continued)

*Primary Examiner* — Jack Chiang
*Assistant Examiner* — Aric Lin
(74) *Attorney, Agent, or Firm* — Workman Nydegger

(57) ABSTRACT

A filter manufacturing method and a filter manufactured by the filter manufacturing method are disclosed. The filter manufacturing method includes designating a use mode in a resonator to a first resonance mode, in response to designating to the first resonance mode, setting a band selected from a designated first frequency band to a passband in the resonator, switching the use mode in the resonator from the first resonance mode to a second resonator mode, in response to switching to the second resonance mode, setting a band selected from the first frequency band except for the passband to a stopband in the resonator, and manufacturing a primary filter including the resonator to which the passband and the stopband are set.

10 Claims, 12 Drawing Sheets

(56)    References Cited

U.S. PATENT DOCUMENTS

| | | | |
|---|---|---|---|
| 6,459,346 B1 | 10/2002 | Sivadas et al. | |
| 6,472,959 B1 | 10/2002 | Beaudin et al. | |
| 8,947,179 B2 | 2/2015 | Haunberger et al. | |
| 2013/0249651 A1 | 9/2013 | Wu et al. | |
| 2016/0099492 A1* | 4/2016 | Yuan ..................... | H01P 1/2084 |
| | | | 333/219.1 |
| 2016/0301378 A1* | 10/2016 | Wang ..................... | H01P 1/2084 |

FOREIGN PATENT DOCUMENTS

| | | | |
|---|---|---|---|
| JP | 2002050902 A | 2/2002 | |
| JP | 2005303889 A | 10/2005 | |
| JP | 2009159328 A | 7/2009 | |
| JP | 2016-536888 A | 11/2016 | |
| KR | 1020000062617 A | 5/2002 | |
| KR | 100783860 B1 | 12/2007 | |
| KR | 100789378 B1 | 12/2007 | |
| KR | 101525518 B1 | 4/2015 | |
| KR | 1020170014828 A | 2/2017 | |
| KR | 101850910 B1 | 4/2018 | |

OTHER PUBLICATIONS

Liu J J, et al., "A multi-mode cavity filter with Jerusalem Cross structure resonater", Nov. 5, 2013, XP032549358.

Cristiano Tomassoni, et al., "A new class of pseudo-elliptic wave-guide filters using resonant posts", Jun. 17, 2012, XP032216911.

Hoeft Michael, et al., "Tunable Bandpass Filters for Multi-Standard Applications", Mar. 12, 2008, XP093026232.

* cited by examiner

Rejection/
return loss (dB)

FILTER MANUFACTURING METHOD AND FILTER MANUFACTURED BY THE METHOD

CROSS-REFERENCE TO RELATED APPLICATIONS

This application claims the benefit under 35 USC § 119(a) of Korean Patent Application No. 10-2021-0148121, filed on Nov. 1, 2021, in the Korean Intellectual Property Office, the entire disclosure of which is incorporated herein by reference for all purposes.

BACKGROUND

1. Field

The disclosure relates to a filter manufacturing method, and more particularly, to a filter design method using a cylindrical resonator having both passband and stopband characteristics.

2. Description of Related Art

Typically, a wireless communication system performs communication by transmitting and receiving a signal using a predetermined frequency band.

On the other hand, when an undesired signal is transmitted/received through an adjacent frequency band, signal distortion may occur, and thus, communication may not be smooth.

Recently, as the types of wireless communication systems have rapidly increased and the complexity of a frequency environment has increased, the phenomenon in which communication is interrupted due to the signal distortion may be expected to intensify.

To suppress a signal entering through an undesired frequency band, a higher-order filter using a plurality of resonators has been proposed.

In case of the higher-order filter, as the number of resonators increases, the performance of the higher-order filter may improve. However, securing a sufficient space to arrange a plurality of resonators is required, and thus, the volume of the higher-order filter may increase, too.

Accordingly, research into a filter design method that may sufficiently suppress an undesired signal using a small number of resonators has been actively conducted.

As an example of a conventional filter design, there is a filter that implements a stopband for suppressing an undesired signal by forming a transmission zero through an additional structure, such as a coupling probe.

Here, the transmission zero may refer to a zero frequency in which a signal is not transmitted, that is, a point on a complex frequency plane at which transmission traffic of a signal reaches "0", and at this time, attenuation of a signal is infinite, and thus, may be referred to as an "attenuation pole".

FIGS. 1A to 1C are diagrams illustrating a filter that implements a stopband by forming a transmission zero based on a prior art.

FIG. 1A represents a structure of a filter that implements a stopband by forming a transmission zero.

In the filter illustrated in FIG. 1A, before the transmission zero is formed, signal interference may occur because, other than a signal that enters through a predetermined frequency band, an undesired signal enters through an adjacent frequency band as illustrated in FIG. 1B. However, after the transmission zero is formed, the undesired signal may be sufficiently suppressed as the stopband is formed in the filter as illustrated in FIG. 1C.

On the other hand, in the filter design method, there may be limits on adjusting a bandwidth or a position of a stopband that has already been formed.

As another example of the filter design, there is a filter that suppresses a signal of an undesired frequency band while passing a signal of a desired frequency band through cascade coupling of a passband filter and a stopband filter.

FIGS. 2A and 2B are diagrams illustrating a filter that implements a passband and a stopband through cascade coupling of a plurality of filters based on a prior art.

FIG. 2A illustrates a structure of a filter manufactured through cascade coupling of a passband filter and a stopband filter.

The filter illustrated in FIG. 2A may suppress a signal of an undesired frequency band while passing a signal of a desired frequency band by simultaneously implementing a passband and a stopband, as illustrated in FIG. 2B.

On the other hand, in this filter design method, the volume of the filter may increase since an additional resonator and a coupling iris for coupling resonators are required.

In addition, conventionally, since a fundamental mode is used when designing a filter, the performance of an unloaded Q-factor of a resonator decreases and the loss characteristic of filter insertion is not excellent.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

An embodiment provides a manufacturing method of a filter with excellent performance and a smaller volume by designing the filter to have both a passband and a stopband using a resonator.

An embodiment provides a manufacturing method of a filter that may independently set a passband and a stopband at desired frequency bands, respectively, by switching a resonance mode (e.g., a "TM110 mode") used by a resonator.

An embodiment provides a manufacturing method of a variable filter that may variably adjust positions and bandwidths of a passband and a stopband through electronic adjustment of a tuning screw used for fixing a resonator after setting the passband and the stopband.

An embodiment provides a manufacturing method of a filter with improved performance by using a cylindrical resonator having an excellent unloaded Q-factor.

An embodiment provides a manufacturing method of a higher-order filter that may improve performance through additionally mounting a resonator that may set a passband and a stopband by switching a resonance mode.

In one general aspect, a filter manufacturing method includes designating a use mode in a resonator to a first resonance mode, in response to designating to the first resonance mode, setting a band selected from a designated first frequency band to a passband in the resonator, switching the use mode in the resonator from the first resonance mode to a second resonator mode, in response to switching to the second resonance mode, setting a band selected from the first frequency band except for the passband to a stopband in the resonator, and manufacturing a primary filter including the resonator to which the passband and the stopband are set.

In another general aspect, a filter manufactured by a filter manufacturing method, the filter is manufactured as a primary filter comprising a single cylindrical resonator in which a passband and a stopband are set by switching a use mode, wherein the single cylindrical resonator is mounted on an inner surface of a housing by a plurality of screws, wherein, when the use mode in the resonator is designated to a first resonance mode, a band from a designated first frequency band is set to the passband, and when the use mode in the resonator is switched from the first resonance mode to a second resonance mode, a band selected from the first frequency band except for the passband is set to the stopband.

According to the present disclosure, a filter that may be widely applicable to a transmitter/receiver of most wireless communication systems that communicate in a complex frequency environment may be manufactured because the filter that may efficiently implement suppression and transmission of a signal of a predetermined band without using an additional filter may be designed using a small number of cylindrical resonators.

According to the present disclosure, a filter with improved performance may be manufactured by using a cylindrical resonator with an excellent unloaded Q-factor.

According to the present disclosure, a variable filter that may variably adjust positions and bandwidths of a passband and a stopband may be manufactured.

According to the present disclosure, a higher-order filter with improved performance in proportion to the number of resonators that may set both a passband and a stopband may be manufactured.

Figure 1A:
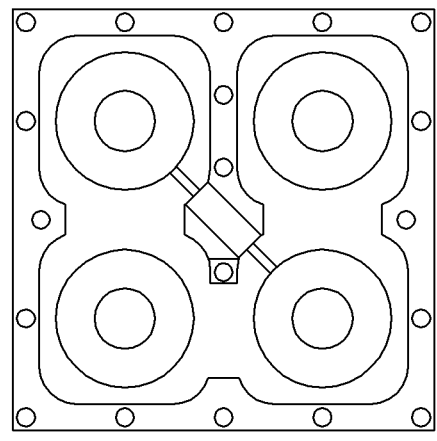
FIGS. 1A to 1C are diagrams illustrating a filter that implements a stopband by forming a transmission zero according to a related art.
Figure 1B:
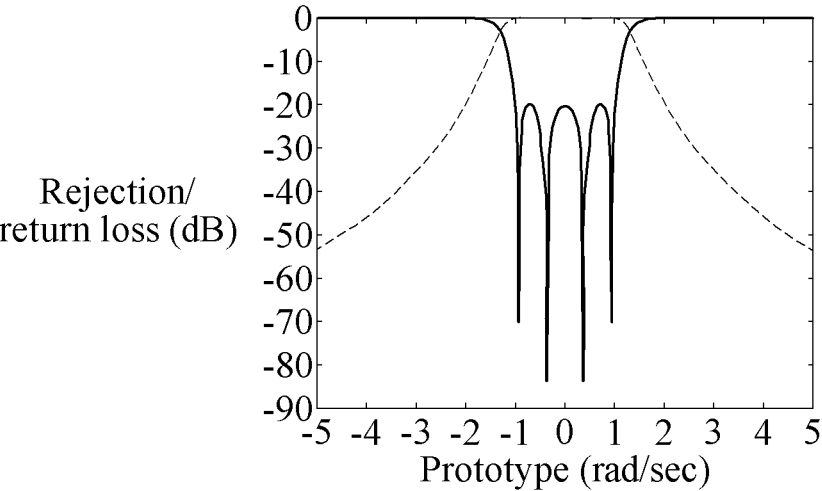
Figure 1C:
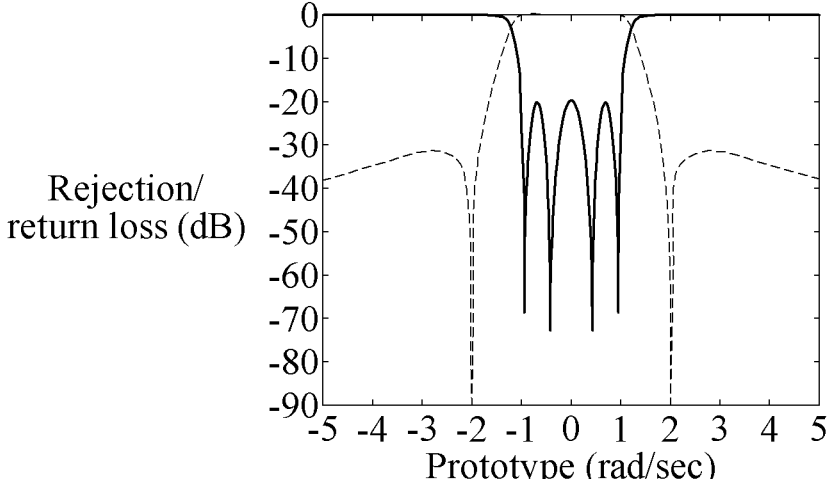
Figure 2A:
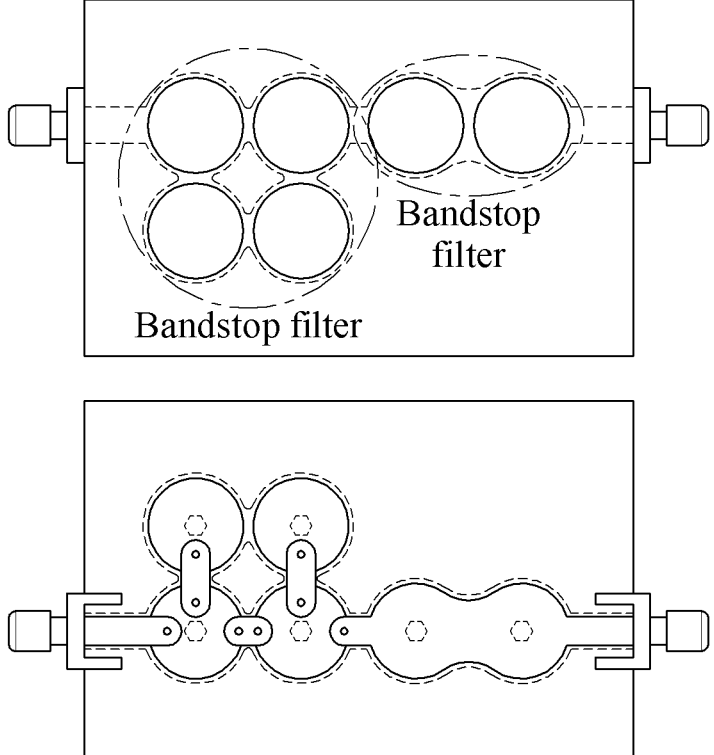
FIGS. 2A and 2B are diagrams illustrating a filter that implements a passband and a stopband through cascade coupling of a plurality of filters according to a related art.
Figure 2B:
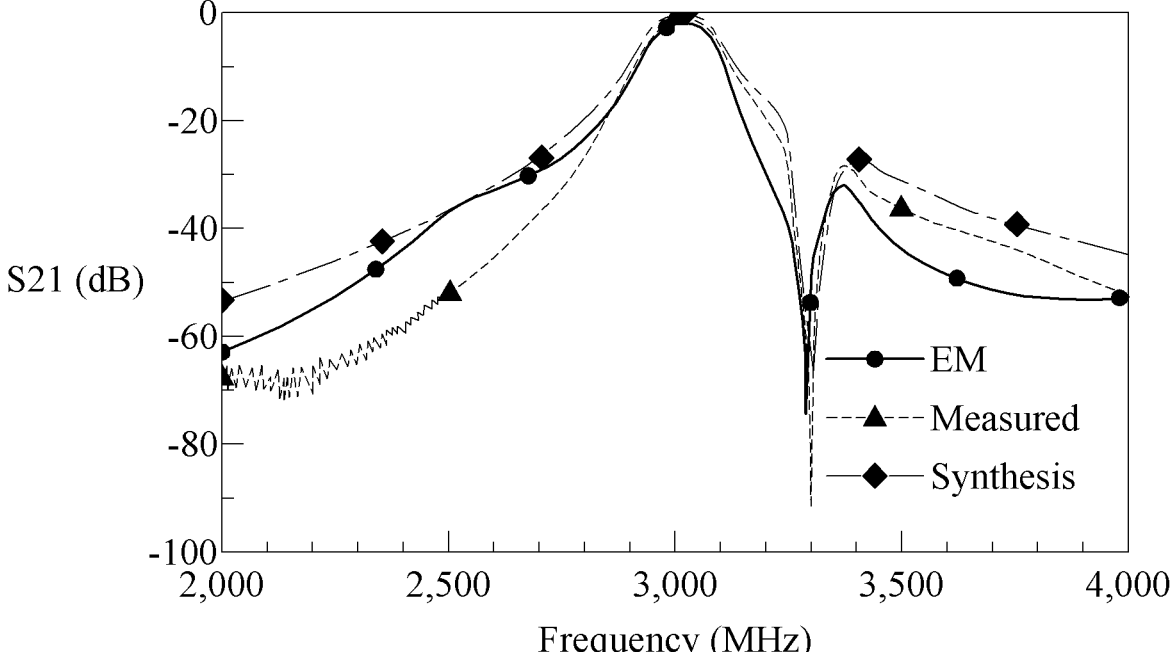

Throughout the drawings and the detailed description, unless otherwise described or provided, the same drawing reference numerals will be understood to refer to the same elements, features, and structures. The drawings may not be to scale, and the relative size, proportions, and depiction of elements in the drawings may be exaggerated for clarity, illustration, and convenience.

DETAILED DESCRIPTION

Hereinafter, example embodiments will be described in detail with reference to the accompanying drawings. However, various alterations and modifications may be made to the example embodiments. Here, the example embodiments are not construed as limited to the disclosure. The example embodiments should be understood to include all changes, equivalents, and replacements within the idea and the technical scope of the disclosure.

The terminology used herein is for the purpose of describing particular example embodiments only and is not to be limiting of the example embodiments. The singular forms "a", "an", and "the" are intended to include the plural forms as well, unless the context clearly indicates otherwise. It will be further understood that the terms "comprises/comprising" and/or "includes/including" when used herein, specify the presence of stated features, integers, steps, operations, elements, and/or components, but do not preclude the presence or addition of one or more other features, integers, steps, operations, elements, components and/or groups thereof.

Unless otherwise defined, all terms including technical and scientific terms used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

When describing the example embodiments with reference to the accompanying drawings, like reference numerals refer to like constituent elements and a repeated description related thereto will be omitted. In the description of example embodiments, detailed description of well-known related structures or functions will be omitted when it is deemed that such description will cause ambiguous interpretation of the present disclosure.

Figure 3A:
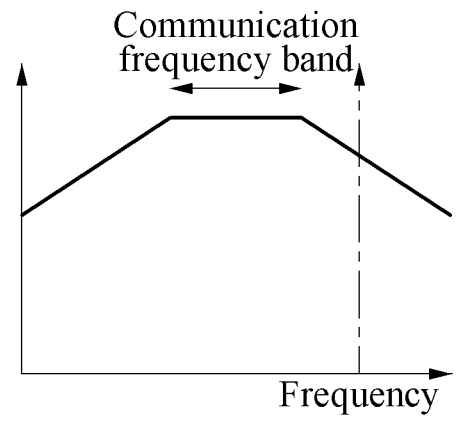
FIGS. 3A to 3C are diagrams illustrating a filter, manufactured by a filter manufacturing method of the present disclosure, that simultaneously implements a passband and a stopband.
Figure 3B:
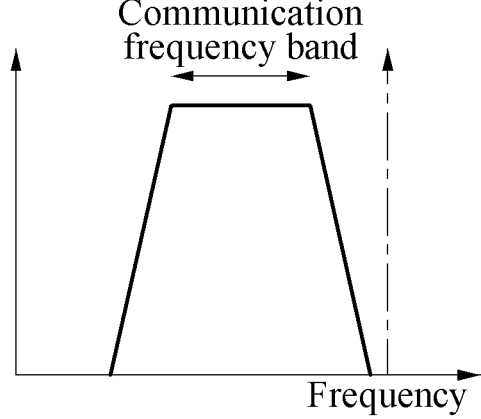
Figure 3C:
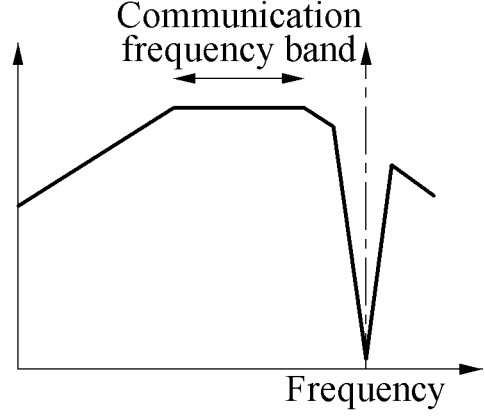

FIGS. 3A to 3C are diagrams illustrating a filter, manufactured by a filter manufacturing method of the present disclosure, that simultaneously implements a passband and a stopband.

FIG. 3A is a diagram conceptually illustrating signal passage and signal suppression through a lower-order filter with a relatively low order, FIG. 3B is a diagram conceptually illustrating signal passage and signal suppression through a higher-order filter with a relatively high order, and FIG. 3C is a diagram conceptually illustrating signal passage and signal suppression through a filter manufactured by the present disclosure.

As illustrated in FIG. 3A, in the lower-order filter, other than a signal corresponding to a determined communication frequency band (that is, a passband), an undesired signal entering from an adjacent frequency band that is adjacent to the passband may not be suppressed and may pass.

As illustrated in FIG. 3B, in the higher-order filter that has better filter performance than the lower-order filter, only a signal corresponding to a determined communication frequency band (that is, a passband) may pass and an undesired signal of an adjacent frequency band may be sufficiently suppressed. However, the higher-order filter may have a relatively large volume.

On the other hand, in the filter manufactured by the present disclosure, a stopband may be implemented with a passband by using a single resonator, and thus, as illustrated in FIG. 3C, a signal corresponding to a determined communication frequency band may pass and an undesired signal entering through an adjacent frequency band may be efficiently suppressed.

Figure 4:
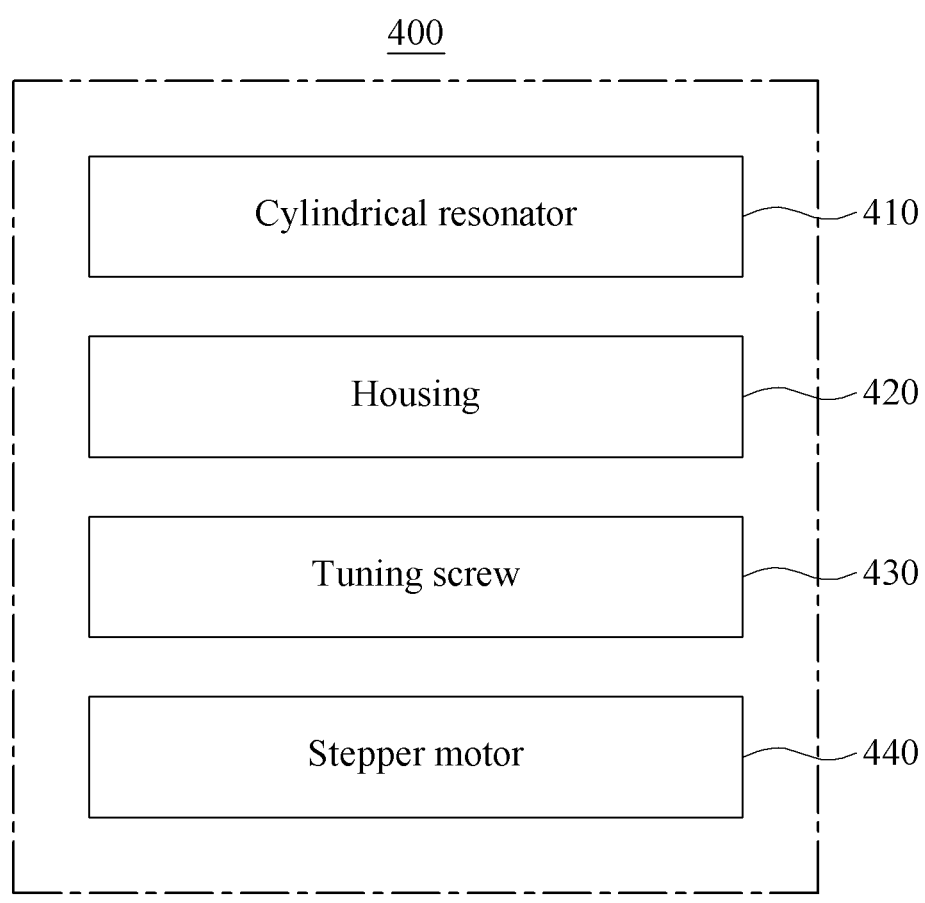
FIG. 4 is a diagram illustrating a filter, manufactured by a filter manufacturing method of the present disclosure, including a cylindrical resonator.

FIG. 4 is a diagram illustrating a filter, manufactured by a filter manufacturing method of the present disclosure, including a cylindrical resonator.

Referring to FIG. 4, a filter 400 manufactured by the filter manufacturing method according to the present disclosure may be manufactured as a primary filter including a single cylindrical resonator 410, a housing 420, a tuning screw 430, and a stepper motor 440.

The single cylindrical resonator 410 may be mounted on the inner surface of the housing 420 by a plurality of tuning screws 430 and both a passband and a stopband may be set to the single cylindrical resonator 410 by switching a use mode.

The single cylindrical resonator 410 may use at least two resonance modes "TM110" based on a symmetry axis of the "H-field" of a generated resonant frequency.

The two resonance modes TM110 may include a first resonance mode "TM110V" when the H-field is vertically symmetric and a second resonance mode "TM110H" when the H-field is horizontally symmetric.

When the use mode (e.g., the TM110 mode) by the single cylindrical resonator 410 is designated to the first resonance mode TM110V, a coupling iris between the single cylindrical resonator 410 and an I/O terminal for a signal may be on a portion where the H-field of the first resonance mode is relatively strong.

Accordingly, a selected band of a designated first frequency band may be set to a passband that is a frequency band for passing a signal entering through the I/O terminal.

In addition, when the use mode (e.g. the "TM110 mode") by the single cylindrical resonator 410 is designated to the second resonance mode TM110H, a coupling iris between the single cylindrical resonator 410 and an I/O terminal for a signal may be on a portion where the H-field of the second resonance mode is relatively strong.

Accordingly, a selected band within the designated first frequency band except for the passband may be set to a stopband that is a frequency band for suppressing a signal entering through the I/O terminal.

As an example of setting the stopband, the stopband may be set to a frequency band in a frequency band that is set to be the passband. For example, when the passband is set between 17 GHz to 18 GHz, the stopband may be set to be 17.5 GHz, which is a value between the upper and lower limits of the passband.

In this case, the filter 400 (the primary filter) may extract signals corresponding to 17 to 18 GHz from a signal input through the I/O terminal, and then may suppress a signal corresponding to 17.5 GHz and output the other signals to the I/O terminal among the extracted signals corresponding to 17 to 18 GHz. Thus, the filter 400 (the primary filter) may effectively suppress an undesired signal of a predetermined frequency band.

In another example of setting a stopband, the stopband may be set to an adjacent frequency band that is adjacent to a frequency band set to the passband.

For example, when the passband is set to 17 to 18 GHz, the stopband may be set to 17.85 GHz, approximately 0.15 GHz lower than the lower limit of the passband or may be set to 18.15 GHz, approximately 0.15 GHz greater than the upper limit of the passband.

Through this, the filter 400 (the primary filter) may alleviate signal distortion that occurs because an undesired signal corresponding to adjacent 17.85 GHz or 18.15 GHz passes together with signals, which are allowed to pass, corresponding to the 17 to 18 GHz frequency band among signals input through the I/O terminal.

In this case, the stopband may be set to have a narrower bandwidth than the passband.

For example, when the passband is set to have a 1 GHz bandwidth between 17 and 18 GHz, the stopband may be set to have a 0.1 GHz bandwidth narrower than the passband.

Through this, the filter 400 (the primary filter) may efficiently suppress an undesired signal of a predetermined frequency band adjacent to the passband.

In other words, the filter 400 may be manufactured as the primary filter including the single cylindrical resonator 410 in which the passband and the stopband are simultaneously implemented by switching a use mode.

When a signal is input through the I/O terminal, the primary filter may extract a frequency band corresponding to the passband from the input signal by a resonant frequency generated by operating the single cylindrical resonator 410 in the first resonance mode.

Thereafter, by a resonant frequency generated by operating the single cylindrical resonator 410 in the second resonance mode, the primary filter may remove a frequency band corresponding to the stopband from the signal from which the frequency band corresponding to the passband is extracted and may output the signal from which the frequency band corresponding to the stopband is removed to the I/O terminal.

That is, when the stopband is set to be a value between the upper and lower limits of the passband, the primary filter may remove an undesired signal of a predetermined frequency band included in signals, which are extracted because the signals correspond to the passband.

In addition, when the stopband is set to an adjacent frequency band that is adjacent to the passband, the primary filter may remove an extracted undesired signal of a predetermined frequency band included in signals which are extracted because the signals correspond to the passband.

Through the primary filter that simultaneously implements the stopband and the passband, signal distortion may be effectively alleviated by suppressing an undesired signal of a predetermined frequency band when extracting a signal of a frequency band corresponding to the passband.

Therefore, according to the present disclosure, a filter that may efficiently implement signal passage and signal suppression of a predetermined band may be designed by using a small number of cylindrical resonators without using an additional filter, and thus, a filter widely applicable to a transmitter/receiver of most wireless communication systems that communicate in a complex frequency environment may be manufactured, and more particularly, a filter with improved performance may be manufactured by using a cylindrical resonator having an excellent unloaded Q-factor.

According to one embodiment, the filter 400 manufactured by the filter manufacturing method of the present disclosure may be manufactured as a variable filter that may independently adjust a set passband and a set stopband.

The single cylindrical resonator 410 in the primary filter may be fixed and mounted on the inner surface of the housing 420 by the plurality of tuning screws 430, and each of the plurality of tuning screws 430 may be electronically tuned by the stepper motor 440.

Figure 9A:
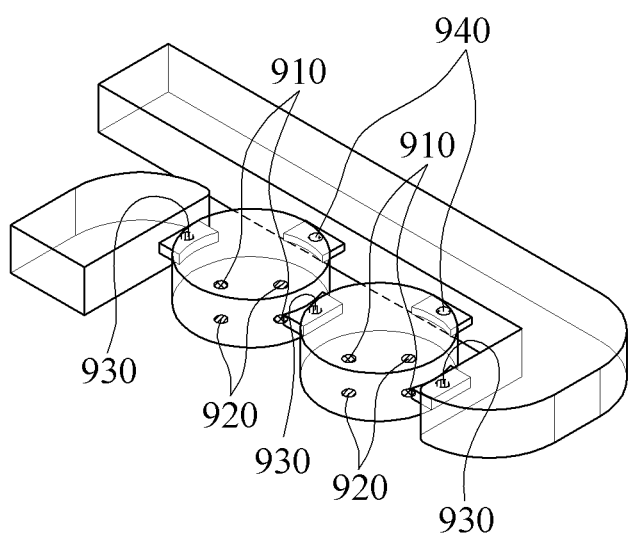
FIGS. 9A and 9B are diagrams illustrating an example of a higher-order filter manufactured by a filter manufacturing method of the present disclosure.
Figure 9B:
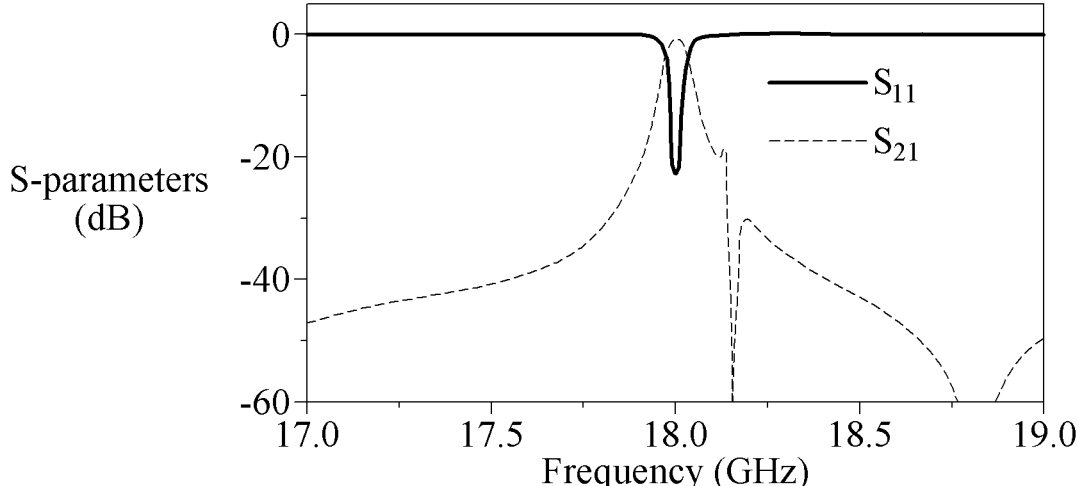

For example, referring to FIGS. 9A and 9B, the single cylindrical resonator 410 may be mounted on the inner surface of the housing 420 by two of first screws 910 arranged in the vertical direction, two of second screws 920 arranged in the horizontal direction, three of third screws 930 arranged in a coupling iris for a passband and two of fourth screws 940 arranged in a coupling iris for a stopband.

The first screw 910 and the third screw 930 may be used to adjust a position and a bandwidth of the set passband, and the second screw 920 and the fourth screw 940 may be used to adjust a position and a bandwidth of the set stopband.

The stepper motor 440 may adjust the position of the passband by tuning the first screw 910 and may increase or decrease the bandwidth of the passband by tuning the third screw 930.

The stepper motor 440 may adjust the position of the stopband by tuning the second screw 920 and may increase or decrease the bandwidth of the stopband by tuning the fourth screw 940.

For example, when the passband is set to 17 to 18 GHz and the stopband is set to 18.15 GHz, the stepper motor 440 may fine-tune the position of the stopband to move to, for example, 18.25 GHz by tuning the second screw 920 by a predetermined value and may also increase the bandwidth of the stopband to, for example, 18.15 to 18.25 GHz, by tuning the fourth screw 940 by a predetermined value.

In other words, the stepper motor 440 may independently adjust bandwidths and positions of the passband and the stopband by selectively tuning the plurality of tuning screws 430.

Other than tuning the tuning screw 430 by the stepper motor 440, bandwidths and positions of a preset passband and a preset stopband may be respectively adjusted by various methods, such as a method of replacing the single cylindrical resonator 410 mounted on the housing 420 with a resonator having a different volume or a method of changing a position of a coupling iris between the single cylindrical resonator 410 and the I/O terminal for a signal.

According to one embodiment, a variable filter that may variably adjust positions and bandwidths of the passband and the stopband, respectively, may be manufactured.

In addition, according to one embodiment, the filter 400 manufactured by the filter manufacturing method may be manufactured as a "higher-order filter" having a form in which the primary filter expands by additionally mounting n (n is a natural number) cylindrical resonators.

That is, the filter 400 may be manufactured as an "n+1-th order filter" additionally mounted on the inner surface of the housing 420 by the plurality of tuning screws 430 and further including n resonators in which passbands and stopbands are respectively set by switching a use mode.

In each of n resonators, by switching the use mode, a passband and a stopband may be set in a frequency band that is different from the other resonator in which the passband and the stopband are previously set.

Specifically, for each of n resonators, when the use mode is set to the first resonance mode, a band selected from a second frequency band that is different from a designated first frequency band may be set to a passband and when the use mode is set to the second resonance mode, a selected band except for the passband may be set to a stopband.

Compared to the primary filter using the single cylindrical resonator 410 in which the passband and the stopband are set in the designated first frequency band, in case of the n+1-th order filter that further uses n+1 cylindrical resonators in which stopbands and passbands are set in the second frequency band, which is different from the first frequency band, a signal of an undesired frequency band may be suppressed for a signal using a wideband based on a wireless communication system.

Therefore, according to one embodiment, a higher-order filter with improved performance in proportion to the number of resonators in which passbands and stopbands may be set may be manufactured.

Figure 5A:
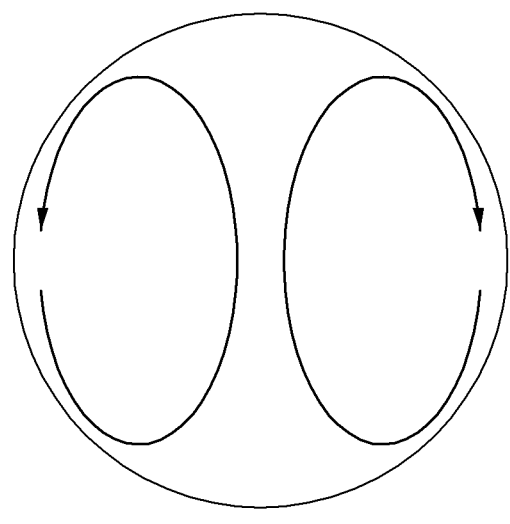
FIGS. 5A and 5B are diagrams illustrating a TM110 mode used by a cylindrical resonator in the filter manufacturing method of the present disclosure.
Figure 5B:
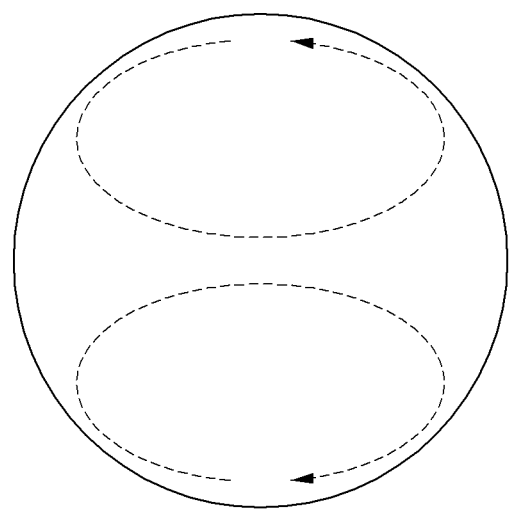
Figure 6A:
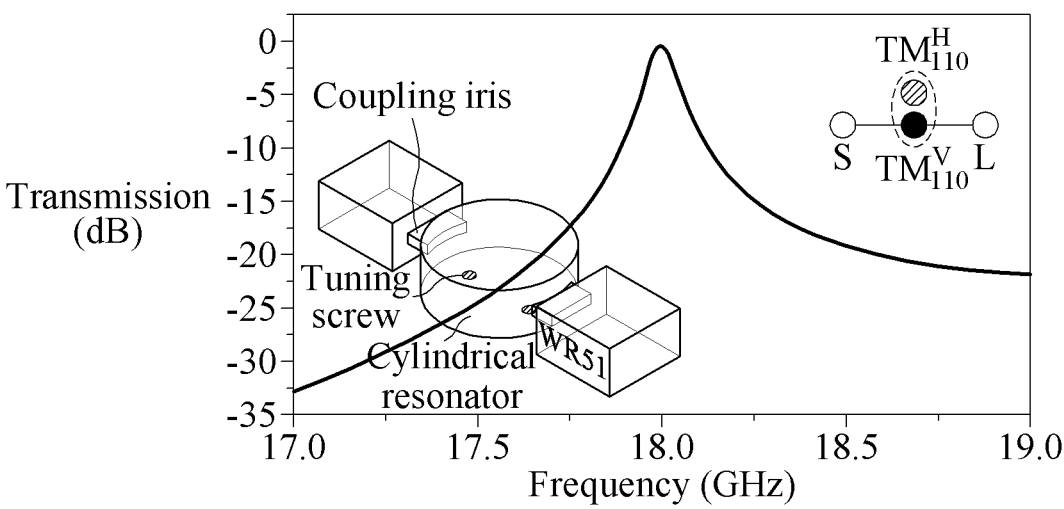
FIGS. 6A and 6B are diagrams illustrating an example of setting a passband and a stopband by switching the TM110 mode used by a cylindrical resonator in the filter manufacturing method of the present disclosure.
Figure 6B:
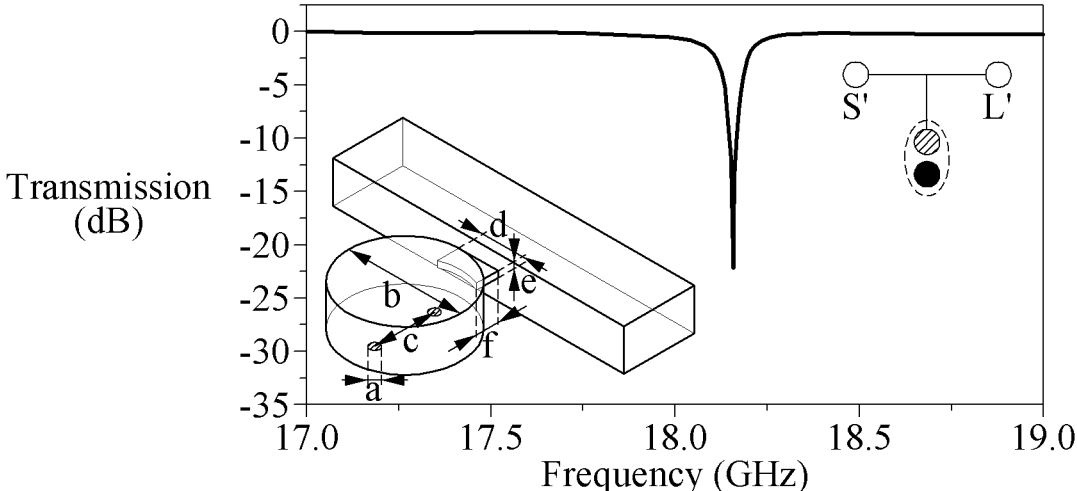

FIGS. 5A and 5B are diagrams illustrating a TM110 mode used by a cylindrical resonator in the filter manufacturing method of the present disclosure, and FIGS. 6A and 6B are diagrams illustrating an example of setting a passband and a stopband by switching the TM110 mode.

Referring to FIGS. 5A and 5B, a single cylindrical resonator may use the TM110 mode that may be switched to at least two resonance modes, TM110V or TM110H, based on a symmetry axis of the H-field of a generated resonant frequency.

FIG. 5A illustrates the resonance mode TM110V when the H-field is vertically symmetrical, and FIG. 6A illustrates an example of setting a passband when the single cylindrical resonator is in the resonance mode TM110V.

When the TM110 mode is set to TM110V, a coupling iris between the single cylindrical resonator and the I/O terminal for a signal may be on a portion where the H-field is relatively strong, and thus, a selected band within the designated first frequency band may be set to the passband as illustrated in FIG. 6A.

FIG. 5B illustrates the resonance mode TM110H when the H-field is horizontally symmetrical, and FIG. 6B illustrates an example of setting a stopband when the single cylindrical resonator is in the resonance mode TM110H.

When the TM110 mode is switched from TM110V to TM110H, the coupling iris between the single cylindrical resonator and the I/O terminal for a signal is positioned on a portion where the H-field is relatively weak, and thus, a selected band within the designated first frequency band except for the passband illustrated in FIG. 6A may be set to the stopband as illustrated in FIG. 6B.

Figure 7A:
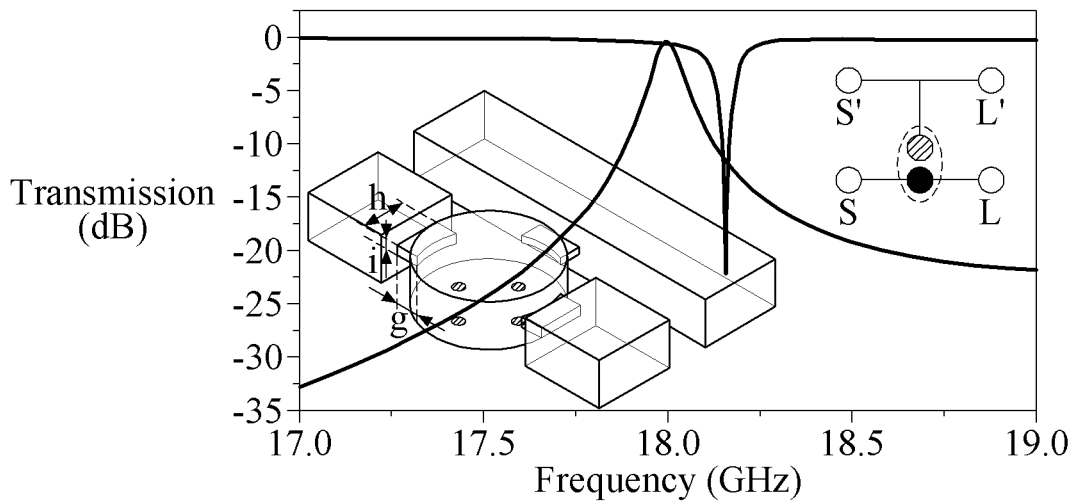
FIGS. 7A and 7B are diagrams illustrating an example of a filter, manufactured by the filter manufacturing method of the present disclosure, in which a passband and a stopband are simultaneously implemented.
Figure 7B:
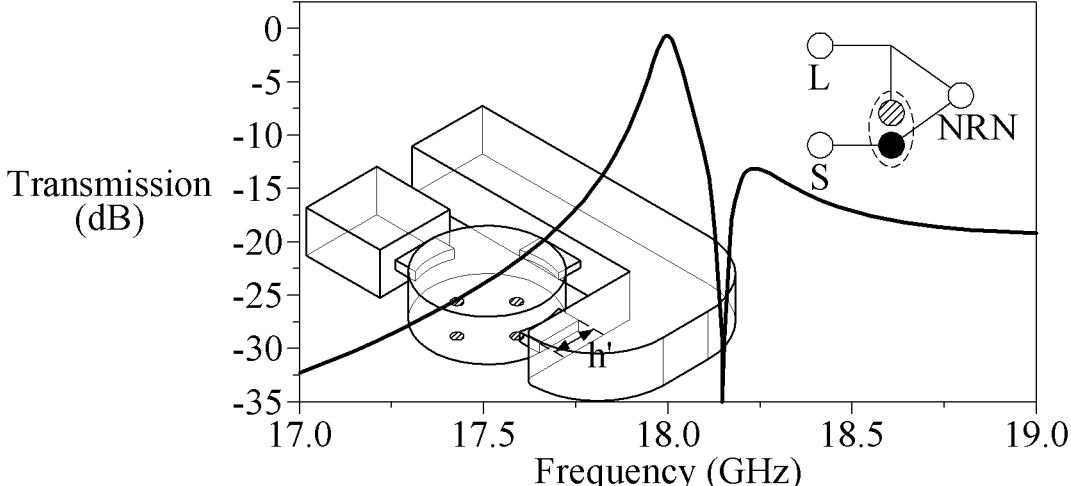

FIGS. 7A and 7B are diagrams illustrating an example of a filter, manufactured by the filter manufacturing method of the present disclosure, in which a passband and a stopband are simultaneously implemented.

FIG. 7A illustrates a simulation result based on a structure of a primary filter and operation of the primary filter.

The primary filter may be manufactured as a filter that simultaneously implements a passband and a stopband by using a single cylindrical resonator fixed and mounted on the inner surface of a housing by a plurality of tuning screws.

According to the simulation result of FIG. 7A, the passband of FIG. 6A may be integrated with the stopband of FIG. 6B.

Here, the example illustrates that the passband corresponds to 18 GHz and the stopband is set to 18.15 GHz adjacent to the passband, and the set passband and stopband may be independently adjusted by changing a tuning screw, the size of a resonator, and a coupling iris.

FIG. 7B illustrates two functions of the primary filter of FIG. 7A.

For example, the primary filter may extract a frequency band corresponding to the passband (e.g., 18 GHz) from a signal input through the I/O terminal by a resonant frequency generated by the resonator as the resonator is operated in TM110V.

Thereafter, by a resonant frequency generated by the resonator as the resonator is operated in TM110H, the primary filter may remove a frequency band corresponding to the stopband (e.g., 18.15 GHz) from the signal from which the frequency band corresponding to the passband (e.g., 18 GHz) is extracted.

Through the two functions described above, when passing a signal of a desired predetermined band among signals input through the I/O terminal, the primary filter may suppress a signal of an undesired predetermined band included in the signals, and thus, may effectively alleviate signal distortion between wireless communication systems for transmitting/receiving a signal.

Figure 8:
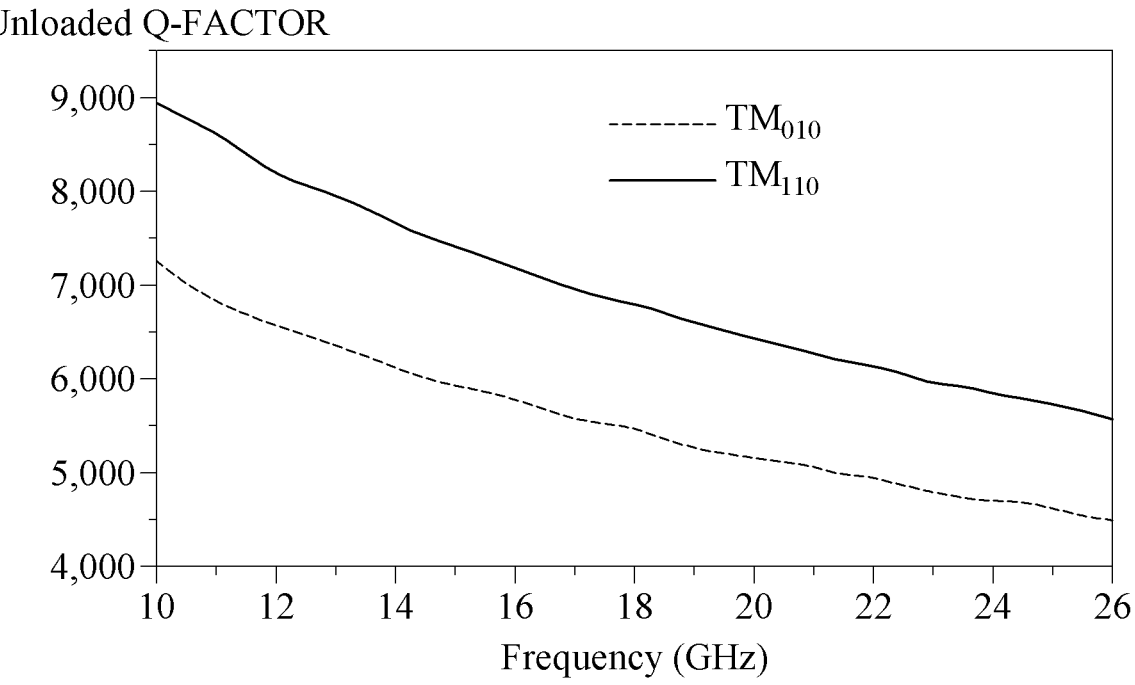
FIG. 8 is a graph comparing characteristics of an unloaded Q-factor based on a resonance mode of the filter manufactured by the filter manufacturing method of the present disclosure.

FIG. 8 is a graph comparing characteristics of an unloaded Q-factor based on a resonance mode of the filter manufactured by the filter manufacturing method of the present disclosure.

FIG. 8 illustrates a graph that compares an unloaded Q-factor characteristic obtained when the resonator uses a TM010 mode (a fundamental mode) in a conventional filter manufacturing method to an unloaded Q-factor characteristic obtained when the resonator uses a TM110 mode in the filter manufacturing method of the present disclosure.

Here, the unloaded Q-factor characteristic in the TM110 mode may be an example of a characteristic obtained by operating the resonator when the passband is set to 18 GHz and the stopband is set to 18.15 GHz, as described with reference to FIG. 7A.

As illustrated in FIG. 8, the unloaded Q-factor characteristic obtained when the resonator uses the TM110 mode in the filter manufacturing method of the present disclosure shows better performance than the unloaded Q-factor obtained when the resonator uses the TM010 mode (the fundamental mode).

FIGS. 9A and 9B are diagrams illustrating an example of a higher-order filter manufactured by a filter manufacturing method of the present disclosure.

FIG. 9A illustrates a structure of a secondary filter using two cylindrical resonators, and FIG. 9B illustrates a simulation result based on operation of the secondary filter.

Here, in each of the two cylindrical resonators, both a passband and a stopband may be set as illustrated in FIG. 7A.

In comparison to FIGS. 7A and 9B, it is identified that the secondary filter with an increased number of cylindrical resonators, compared to the primary filter, shows improved filter performance in proportion to the number of cylindrical resonators.

Figure 10:
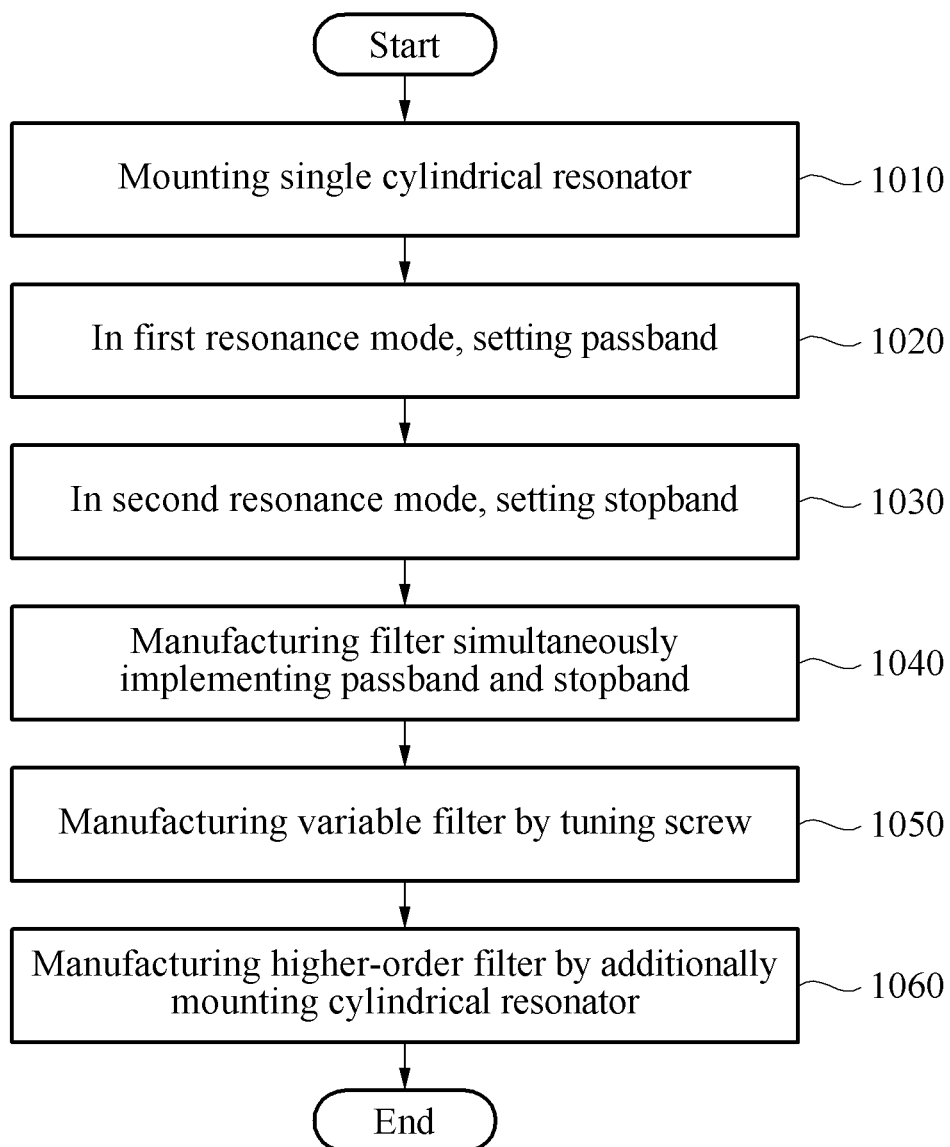
FIG. 10 is a flowchart illustrating an order of a filter manufacturing method according to the present disclosure.

FIG. 10 is a flowchart illustrating an order of a filter manufacturing method according to the present disclosure.

Referring to FIG. 10, in operation 1010, a single cylindrical resonator may be mounted, in operation 1020, a passband may be set while the TM110 mode of the single cylindrical resonator is designated to the first resonance mode, in operation 1030, a stopband may be set while the TM110 mode of the single cylindrical resonator is switched to the second resonance mode, and in operation 1040, a filter that simultaneously implements the passband and the stopband may be manufactured.

To describe the filter manufacturing method performed by operations 1010 to 1040 in detail, the filter manufacturing method may include designating a use mode (the TM110 mode) in a resonator to the first resonance mode, in response to designating to the first resonance mode, setting a band selected from a designated first frequency band to a passband in the resonator, switching the use mode in the resonator from the first resonance mode to a second resonator mode, in response to switching to the second resonance mode, setting a band selected from the first frequency band except for the passband to a stopband in the resonator, and manufacturing a primary filter including the resonator to which the passband and the stopband are set.

Here, the first resonance mode may correspond to the mode TM110V in which an H-field of the resonant frequency generated by the resonator is vertically symmetrical, and the filter manufacturing method may further include, in response to designating to the first resonance mode, determining whether a coupling iris between the resonator and an I/O terminal is positioned in an area where a magnitude of the H-field is equal to or greater than a threshold, and when positioned in an area, setting the selected band to the passband in the resonator.

That is, in the filter manufacturing method, the passband may be designed by positioning the coupling iris between the resonator and the I/O terminal for a signal in an area where the H-field is relatively strong while the resonator is in the first resonance mode, i.e., TM110V.

In addition, the second resonance mode may correspond to the mode TM110H in which an H-field of the resonant frequency generated by the resonator is horizontally symmetrical, and the filter manufacturing method may further include, in response to switching to the second resonance mode, determining whether a coupling iris between the resonator and the I/O terminal is positioned on a portion where a magnitude of the H-field is equal to or greater than a threshold, and when positioned on the portion, setting the selected band to the stopband in the resonator.

That is, in the filter manufacturing method, the stopband may be designed by positioning the coupling iris between the resonator and the I/O terminal for a signal in an area where the H-field is relatively strong while the resonator is in the second resonance mode TM110H.

In the first resonance mode TM110V, the area where the H-field is strong may refer to an area where the H-field is weak in the second resonance mode TM110H.

Conversely, the area where the H-field is strong in the second resonance mode TM110H may refer to an area where the H-field is weak in the first resonance mode TM110V.

In other words, in the first resonance mode TM110V and the second resonance mode TM110H, areas where the H-field is strong may have relative relationships and may have minimum influences on each other, and thus, the filter manufacturing method may simultaneously design the passband and the stopband by using each mode for the single resonator.

In addition, the filter manufacturing method may manufacture a filter with improved performance by using a cylindrical resonator including an excellent unloaded Q-factor.

The primary filter manufactured by the filter manufacturing method may extract a frequency band corresponding to the passband from the input signal by a resonant frequency generated by operating the resonator in the first resonance mode, may remove a frequency band corresponding to the stopband from the signal, from which the frequency band corresponding to the passband is removed, by a resonant frequency generated by operating the resonator in the second resonance mode, and may output the signal from which the frequency band corresponding to the stopband is removed to the I/O terminal.

Therefore, according to the present disclosure, by designing a filter simultaneously including the passband and the stopband by using a single resonator, a filter with excellent performance and smaller volume may be manufactured.

According to one embodiment, in operation 1050, a variable filter by tuning a screw may be manufactured.

In one embodiment, a plurality of screws configured to mount the resonator on the inner surface of a housing may be tuned by a stepper motor and the filter manufacturing method may further include increasing or decreasing a bandwidth of a band that is set to the passband by tuning a first screw and a third screw of the plurality of screws, or increasing or decreasing a bandwidth of a band that is set to the stopband by tuning a second screw and a fourth screw of the plurality of screws.

Therefore, according to one embodiment, by switching the resonance mode TM110 used by a single resonator, a variable filter that may independently set a passband and a stopband, respectively, to be in desired frequency bands may be manufactured.

According to one embodiment, in operation 1060, a higher-order filter by additionally mounting a cylindrical resonator may be manufactured.

The filter manufacturing method may further include, for each of n resonators additionally mounted on the inner surface of the housing, wherein n is a natural number, designating the use mode to the first resonance mode, setting a band selected from a second frequency band that is different from the first frequency band to the passband, in response to designating to the first resonance mode, switching the use mode from the first resonance mode to the second resonance mode, in response to switching to the second resonance mode, setting a band selected from the second frequency band except for the passband to the stopband, manufacturing an n+1-th order filter by expanding the primary filter by further including the n resonators in which the passbands and the stopbands are respectively set.

Therefore, according to the present disclosure, the higher-order filter that may further improve performance by additionally mounting a resonator that may set both a passband and a stopband by switching a resonance mode may be manufactured.

The methods according to the above-described examples may be recorded in non-transitory computer-readable media including program instructions to implement various operations of the above-described example embodiments. The media may also include, alone or in combination with the program instructions, data files, data structures, and the like. The program instructions recorded on the media may be those specially designed and constructed for the purposes of example embodiments, or they may be of the kind well-known and available to those having skill in the computer software arts. Examples of non-transitory computer-readable media include magnetic media such as hard disks, floppy disks, and magnetic tape; optical media such as CD-ROM discs, DVDs, and/or Blue-ray discs; magneto-optical media such as optical discs; and hardware devices that are specially configured to store and perform program instructions, such as read-only memory (ROM), random access memory (RAM), flash memory (e.g., USB flash drives, memory cards, memory sticks, etc.), and the like. Examples of program instructions include both machine code, such as produced by a compiler, and files containing higher-level code that may be executed by the computer using an interpreter. The above-described devices may be configured to act as one or more software modules in order to perform the operations of the above-described example embodiments, or vice versa.

The software may include a computer program, a piece of code, an instruction, or some combination thereof, to independently or uniformly instruct or configure the processing device to operate as desired. Software and data may be embodied permanently or temporarily in any type of machine, component, physical or pseudo equipment, computer storage medium or device, or in a propagated signal wave capable of providing instructions or data to or being interpreted by the processing device. The software also may be distributed over network-coupled computer systems so that the software is stored and executed in a distributed fashion. The software and data may be stored by one or more non-transitory computer-readable recording mediums.

A number of example embodiments have been described above. Nevertheless, it should be understood that various modifications may be made to these example embodiments. For example, suitable results may be achieved if the described techniques are performed in a different order and/or if components in a described system, architecture, device, or circuit are combined in a different manner and/or replaced or supplemented by other components or their equivalents.

Therefore, the scope of the disclosure is defined not by the detailed description, but by the claims and their equivalents, and all variations within the scope of the claims and their equivalents are to be construed as being included in the disclosure.

What is claimed is:

1. A filter manufacturing method comprising:

designating a use mode in a resonator to a first resonance mode;

in response to designating to the first resonance mode, setting a band selected from a designated first frequency band to a passband in the resonator;

switching the use mode in the resonator from the first resonance mode to a second resonance mode;

in response to switching to the second resonance mode, setting a band selected from the first frequency band except for the passband to a stopband in the resonator; and manufacturing a primary filter comprising the resonator to which the passband and the stopband are set, wherein a plurality of screws configured to mount the resonator on an inner surface of a housing is tunable by a stepper motor, the filter manufacturing method further comprising:

increasing or decreasing a bandwidth of a band that is set to the passband by tuning a first screw and a third screw of the plurality of screws; or increasing or decreasing a bandwidth of a band that is set to the stopband by tuning a second screw and a fourth screw of the plurality of screws.

2. The filter manufacturing method of claim 1, wherein, when a signal is input to the primary filter through an input/output (I/O) terminal, the primary filter is configured to:

extract a frequency band corresponding to the passband from the input signal by a resonant frequency generated by operating the resonator in the first resonance mode, and remove a frequency band corresponding to the stopband from the signal, from which the frequency band corresponding to the passband is removed, by a resonant frequency generated by operating the resonator in the second resonance mode and output the signal from which the frequency band corresponding to the stopband is removed to the I/O terminal.

3. The filter manufacturing method of claim 1, wherein the first resonance mode corresponds to a mode in which an H-field of the resonant frequency generated by the resonator is vertically symmetrical, the filter manufacturing method further comprising:

in response to designating to the first resonance mode, determining whether a coupling iris between the resonator and an input/output (I/O) terminal is positioned in an area where a magnitude of the H-field is equal to or greater than a threshold; and when positioned in the area, setting the selected band to the passband in the resonator.

4. The filter manufacturing method of claim 1, wherein the second resonance mode corresponds to a mode in which an H-field of the resonant frequency generated by the resonator is horizontally symmetrical, the filter manufacturing method, further comprising:

in response to switching to the second resonance mode, determining whether a coupling iris between the resonator and an input/output (I/O) terminal is positioned on a portion where a magnitude of the H-field is equal to or greater than a threshold; and when positioned on the portion, setting the selected band to the stopband in the resonator.

5. The filter manufacturing method of claim 1, further comprising:

for each of n resonators additionally mounted on the inner surface of the housing, wherein n is a natural number, designating the use mode to the first resonance mode;

setting a band selected from a second frequency band that is different from the first frequency band to the passband, in response to designating to the first resonance mode;

switching the use mode from the first resonance mode to the second resonance mode;

in response to switching to the second resonance mode, setting a band selected from the second frequency band except for the passband to the stopband;

manufacturing an n+1-th order filter by expanding the primary filter by further comprising the n resonators in which the passbands and the stopbands are respectively set.

6. The filter manufacturing method of claim 1, wherein the resonator uses a TM110 mode such that the resonator comprises a higher unloaded Q-factor compared to other resonators using a fundamental TM010 mode.

7. A non-transitory computer-readable storage medium storing instructions that, when executed by a processor, cause the processor to perform the method of claim 1.

8. A filter manufactured by a filter manufacturing method, the filter being manufactured as a primary filter comprising a single cylindrical resonator in which a passband and a stopband are set by switching a use mode, wherein the single cylindrical resonator is mounted on an inner surface of a housing by a plurality of screws, wherein, when the use mode in the resonator is designated to a first resonance mode, a band from a designated first frequency band is set to the passband, and when the use mode in the resonator is switched from the first resonance mode to a second resonance mode, a band selected from the first frequency band except for the passband is set to the stopband, wherein a plurality of screws configured to mount the resonator on an inner surface of a housing is tunable by a stepper motor, and the stepper motor is configured to increase or decrease a bandwidth of a band that is set to the passband by tuning a first screw and a third screw of the plurality of screws; or increase or decrease a bandwidth of a band that is set to the stopband by tuning a second screw and a fourth screw of the plurality of screws.

9. The filter of claim 8, wherein the primary filter is configured to:

when a signal is input to an input/output (I/O) terminal, extract a frequency band corresponding to the passband from the input signal by a resonant frequency generated by operating the resonator in the first resonance mode, and remove a frequency band corresponding to the stopband from the signal, from which the frequency band corresponding to the passband is removed, by a resonant frequency generated by operating the resonator in the second resonance mode and output the signal from which the frequency band corresponding to the stopband is removed to the I/O terminal.

10. The filter of claim 8, wherein the filter is manufactured as an n+1-th order filter that further comprises n resonators in which a passband and a stopband are set by switching the use mode, wherein n is a natural number, and the n resonators are additionally mounted on the inner surface of the housing by the plurality of screws, and in each of the n resonators, in response to switching the use mode, the passband and the stopband are set among a second frequency band different from the first frequency band.

* * * * *